(12) United States Patent
Chen et al.

(10) Patent No.: US 8,049,114 B2
(45) Date of Patent: Nov. 1, 2011

(54) PACKAGE SUBSTRATE WITH A CAVITY, SEMICONDUCTOR PACKAGE AND FABRICATION METHOD THEREOF

(75) Inventors: Kuo-Ching Chen, Changhua (TW); Tsung-Yuan Chen, Taoyuan County (TW); Cheng-Pin Chien, Shulin (TW)

(73) Assignee: Unimicron Technology Corp., Kwei-San Industrial Zone, Taoyuan (TW)

( * ) Notice: Subject to any disclaimer, the term of this patent is extended or adjusted under 35 U.S.C. 154(b) by 429 days.

(21) Appl. No.: 12/408,719

(22) Filed: Mar. 22, 2009

(65) Prior Publication Data

US 2010/0236817 A1 Sep. 23, 2010

(51) Int. Cl.
*H05K 1/03* (2006.01)
(52) U.S. Cl. ......................... 174/257; 361/749
(58) Field of Classification Search ............... 174/250, 174/252–257, 260; 361/748–751; 257/686–688
See application file for complete search history.

(56) References Cited

U.S. PATENT DOCUMENTS

| 6,625,880 B2 | 9/2003 | Nabemoto et al. |
| 2005/0224988 A1 | 10/2005 | Tuominen |
| 2007/0131349 A1 | 6/2007 | Tuominen et al. |
| 2008/0029890 A1 | 2/2008 | Cheng |

FOREIGN PATENT DOCUMENTS

JP 2002-185097 6/2002

*Primary Examiner* — Khiem Nguyen
(74) *Attorney, Agent, or Firm* — Winston Hsu; Scott Margo

(57) ABSTRACT

A method of making a package substrate includes providing a cladding sheet comprising a first metal layer, a second metal layer and an intermediate layer between the first and second metal layers; etching away a portion of the first metal layer to expose a portion of the intermediate layer thereby forming a metal island body; laminating a first copper clad on the cladding sheet comprising a first copper foil and a first insulating layer; patterning the first copper foil to form a first circuit trace; patterning the second metal layer to form a second circuit trace; removing the metal island body to form a cavity in the first insulating layer; and removing the intermediate layer from bottom of the cavity.

4 Claims, 7 Drawing Sheets

PACKAGE SUBSTRATE WITH A CAVITY, SEMICONDUCTOR PACKAGE AND FABRICATION METHOD THEREOF

BACKGROUND OF THE INVENTION

1. Field of the Invention

The present invention relates to a package substrate, semiconductor package and fabrication method thereof. More particularly, this invention relates to a package substrate with a cavity, package-on-package and fabrication method thereof.

2. Description of the Prior Art

The need in recent years for increased chip capacity and density with a smaller footprint has led to development of three-dimensional packages and packaging techniques. Three-dimensional packages generally allow smaller, thinner packages and are considered to offer a solution for high packaging density and enhanced electrical performance, which are required for the present and future electronic systems.

One type of three-dimensional packages is Package-on-Package (PoP), which is an integrated circuit packaging technique to allow vertically combining discrete logic and memory ball grid array (BGA) packages. Two or more packages are installed on top of one another, i.e. stacked, with a standard interface to route signals between them. This allows higher density, for example in the mobile telephone market.

FIG. 1 is a schematic, cross-sectional diagram showing a conventional PoP structure. As shown in FIG. 1, the conventional PoP structure 1 comprises a first package 2 and a second package 3 stacked on the first package 2. The first package 2 comprises a first die 20 mounted on a first carrier substrate 22 and the first die 20 is electrically connected to the first carrier substrate 22 through bond wires 26 such as gold wires. The first die 20 and the bond wires 26 are encapsulated by a molding compound 24. The second package 3 comprises a second die 30 mounted on a second carrier substrate 32 and the second die 30 is electrically connected to the second carrier substrate 32 through bond wires 36. Likewise, the second die 30 and the bond wires 36 are encapsulated by molding compound 34. The second carrier substrate 32 of the second package 3 is electrically connected to the first carrier substrate 22 of the first package 2 using solder balls 40. Ordinarily, underfill 42 is applied to fill the gap between the first and second carrier substrates 22 and 32 to prevent solder balls 40 from damage due to stress.

However, the aforesaid conventional PoP structure 1 has several shortcomings. First, the size and dimension of the solder balls 40 are strictly limited to the distance between the first and second carrier substrates 22 and 32. The height of each of the solder balls 40 must exceed the height of the molding compound 24 to ensure reliable electrical connection between the first and second carrier substrates 22 and 32. Therefore, it is difficult to decrease the pitch of the solder balls 40, which leads to restricted number of the I/O pin count. Second, The mismatch of coefficient of thermal expansion (CTE) between the first and second carrier substrates 22 and 32 may lead to concentration of stress on the solder balls 40 and thus affecting reliability of the package. Third, the control of the coplanarity of the solder balls 40 is difficult, which leads to smaller process window.

Further, the prior art PoP package structure needs additional underfill between the first and second carrier substrates 22 and 32 for reliability concern. Furthermore, the prior art PoP package structure occupies larger space.

U.S. Pat. No. 6,625,880 discloses a multi-layer printed wiring board manufactured by forming a wiring pattern and a component mounting portion on a first substrate. An insulating spacer, formed with a first opening, is stacked over the first substrate with the first opening in registration with the component mounting portion. A second substrate is stacked over the spacer and the resulting assembly is bonded together. A second opening, continuing to the first opening, is formed in the second substrate, exposing the component mounting portion to the outside. An LSI is mounted on the component mounting portion, the first and second openings are filled with a synthetic resin mass, and then a third substrate is stacked over the second substrate to enclose the openings.

SUMMARY OF THE INVENTION

It is one objective of the present invention to provide an improved package substrate, semiconductor package and fabrication method thereof in order to overcome the above-mentioned prior art shortcomings and drawbacks.

According to the claimed invention, a method for fabricating a package substrate includes providing a cladding sheet having a first metal layer, a second metal layer and an intermediate layer between the first metal layer and the second metal layer; etching away a portion of the first metal layer to expose a portion of the intermediate layer, thereby forming a metal block; laminating the cladding sheet with a first copper clad laminate (CCL) comprising a first insulating layer and a first copper foil layer; patterning the first copper foil layer to form a first trace pattern; patterning the second metal layer to form a second trace pattern; removing the metal block to form a cavity; and removing the intermediate layer from the cavity.

From one aspect, according to another embodiment, a method for fabricating a semiconductor package includes providing a cladding sheet having a first metal layer, a second metal layer and an intermediate layer between the first metal layer and the second metal layer; etching away a portion of the first metal layer to expose a portion of the intermediate layer, thereby forming a metal block; laminating the cladding sheet with a first copper clad laminate (CCL) comprising a first insulating layer and a first copper foil layer; patterning the first copper foil layer to form a first trace pattern; patterning the second metal layer to form a second trace pattern, wherein the second trace pattern comprises a plurality of flip-chip bond pads connecting the metal block; removing the metal block to form a cavity; removing the intermediate layer from the cavity; mounting a flip-chip inside the cavity, the flip-chip having an active surface facing the flip-chip bond pads and electrically connecting to the flip-chip bond pads through solder balls; and filling the cavity with a filler to encapsulate the flip-chip.

From another aspect, in accordance with another embodiment, a package substrate with a cavity includes a first insulating layer; a cavity in the first insulating layer; a first trace pattern on one side of the first insulating layer; a second trace pattern on the other side of the first insulating layer opposite being opposite to the first trace pattern, wherein the second trace pattern comprises a plurality of flip-chip bond pads at a bottom of the cavity, and a portion of the second trace pattern is a dual-layer metal structure comprising a copper layer and an intermediate metal layer; and a plurality of first plated through holes in the first insulating layer for electrically connecting the first trace pattern with the second trace pattern.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
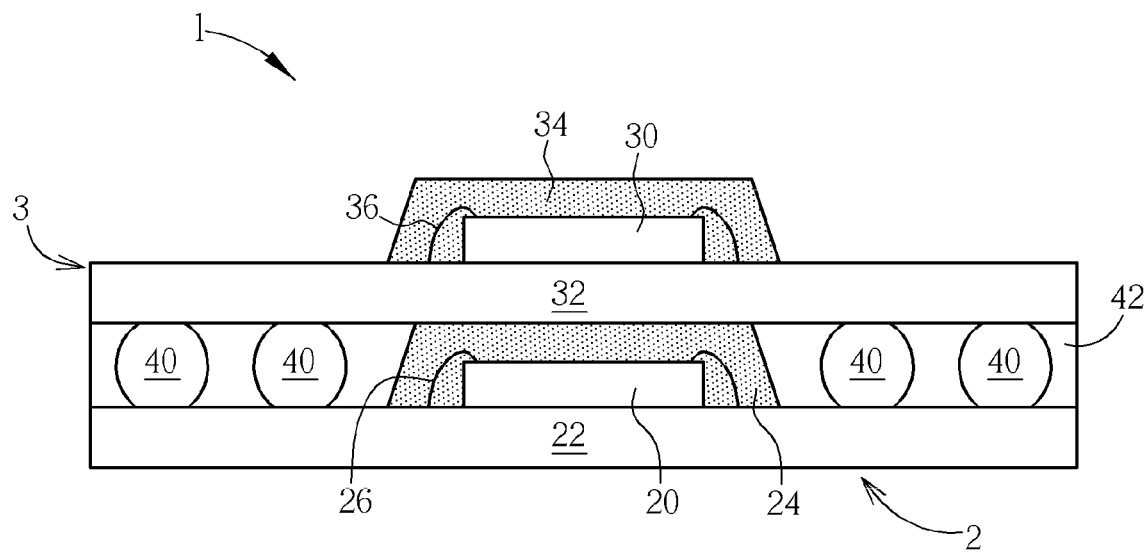
FIG. 1 is a schematic, cross-sectional diagram showing a conventional PoP structure.
Figure 2:
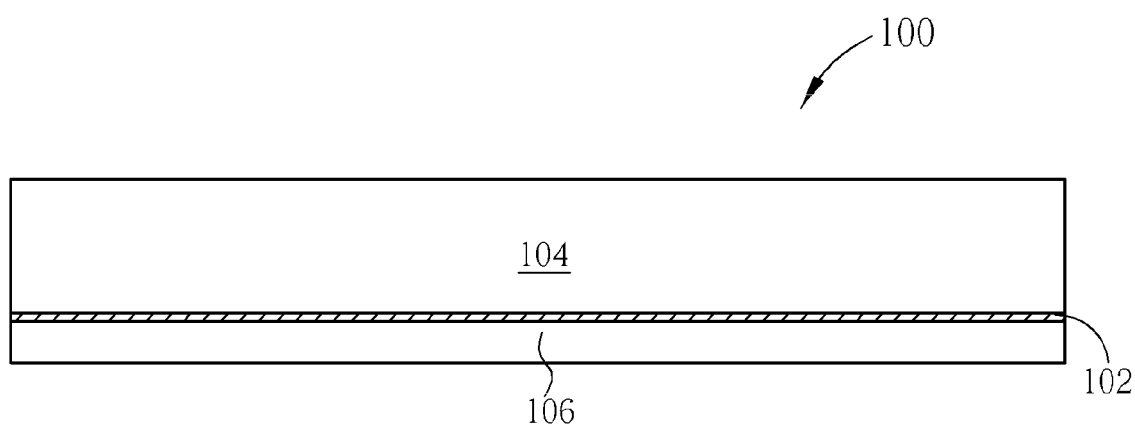
FIG. 2 to FIG. 13 are schematic, cross-sectional diagrams illustrating a process of fabricating a package-on-package structure in accordance with one preferred embodiment of this invention.

Please refer to FIG. 2 to FIG. 13. FIG. 2 to FIG. 13 are schematic, cross-sectional diagrams illustrating a process of fabricating a package-on-package structure in accordance with one preferred embodiment of this invention. First, as shown in FIG. 2, a cladding sheet 100 such as a Cu—Ni—Cu composite metal substrate, a Cu—Al—Cu composite metal substrate or a copper clad laminate (CCL) is provided. The cladding sheet 100 comprises an intermediate layer 102, a first metal layer 104 laminated on the first side of the intermediate layer 102, and a second metal layer 106 laminated on the second side opposite to the first side of the intermediate layer 102. Preferably, the first metal layer 104 is made of copper and has a thickness of about, for example, 30-150 micrometers. The thickness of the first metal layer 104 is greater than that of the second metal layer 106. Preferably, the second metal layer 106 is made of copper and has a thickness of about 1-50 micrometers. In a case that the cladding sheet 100 is a CCL, the intermediate layer 102 may be composed of glass fiber, epoxy resins or thermosetting resins.

Figure 3:
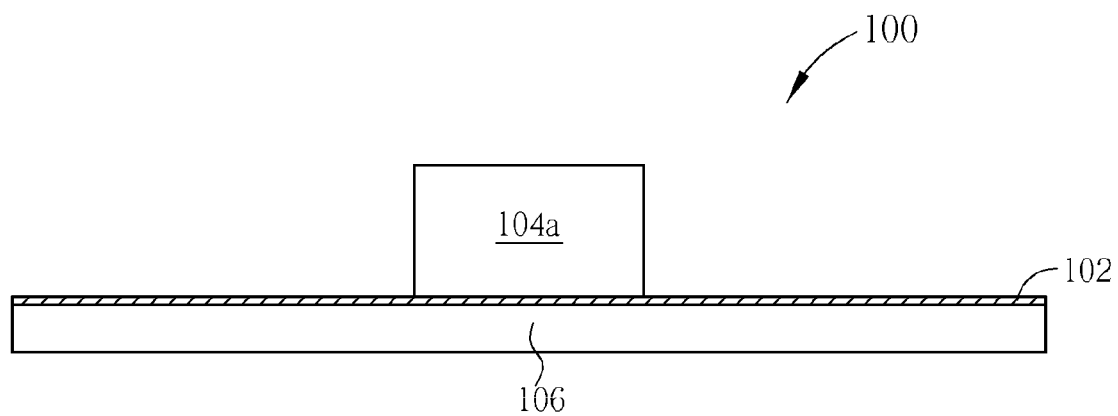

As shown in FIG. 3, a lithographic process and an etching process are carried out to etch away a portion of the first metal layer 104 thereby defining and forming a metal block 104a. The aforesaid lithographic process and the etching process may comprise: forming a photoresist pattern (not shown) on the first metal layer 104 for defining the shape and dimension of the metal block to be formed in the first metal layer 104, then etching away the first metal layer 104 that is not covered by the photoresist pattern by wet etching methods or dry etching methods to expose a portion of the intermediate layer 102. According to the preferred embodiment of this invention, the dimension of the metal block 104a may be between 0.5 mm×0.5 mm and 10 mm×10 mm. According to another embodiment, the exposed portion of the intermediate layer 102 may be removed and only leaving the intermediate layer 102 directly underneath the metal block 104a intact.

Figure 4:
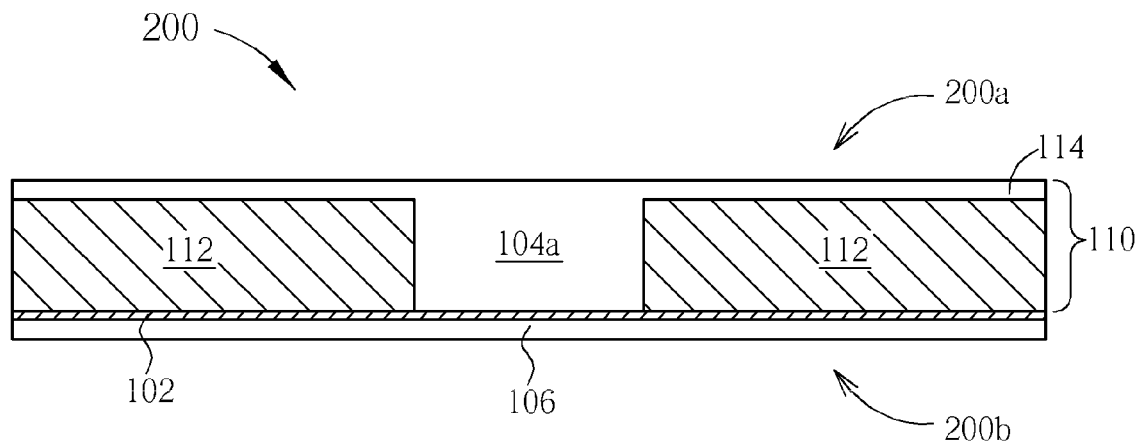

As shown in FIG. 4, after the formation of the metal block 104a, the cladding sheet 100 and a first single-sided CCL 110 are laminated together by press lamination methods to form a substrate 200, wherein the first single-sided CCL 110 comprises a first insulating layer 112, for example, prepreg, and a first copper foil layer 114. At this point, the first side 200a of the substrate 200 has the first copper foil layer 114 and the second side 200b has the second metal layer 106.

Figure 5:
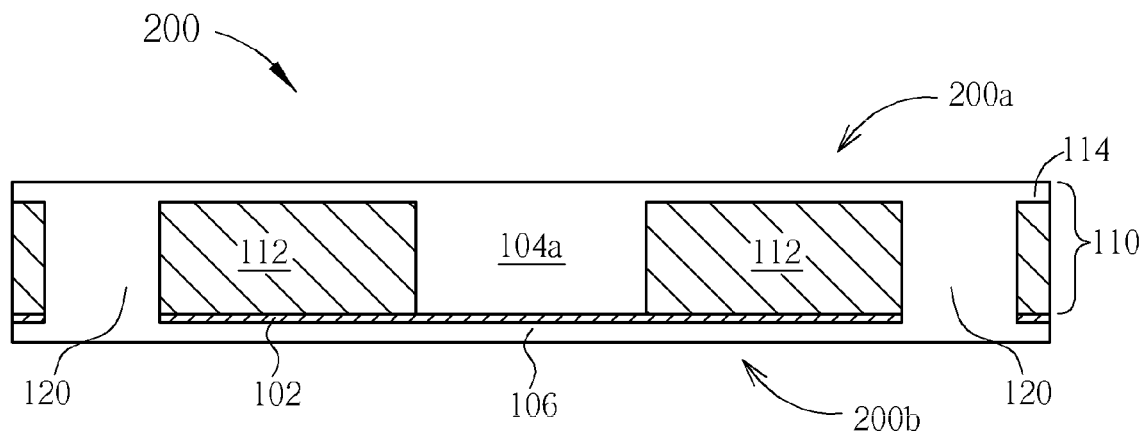

As shown in FIG. 5, subsequently, a plated through hole (PTH) fabrication process is performed to form a plurality of first plated through holes 120 in the substrate 200. The plurality of first plated through holes 120 electrically connect the first copper foil layer 114 on the first side 200a of the substrate 200 with the second metal layer 106 on the second side 200b. The aforesaid PTH fabrication process is well known in the art and may comprise through drilling, chemical copper plating and copper electroplating.

Figure 6:
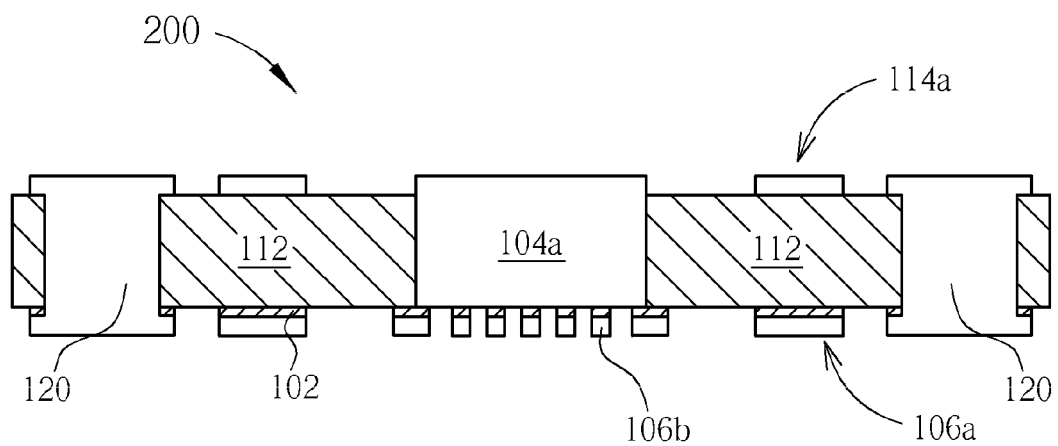

As shown in FIG. 6, a conventional lithographic process and an etching process are performed to etch away a portion of the first copper foil layer 114 from the first side 200a of the substrate 200 and to remove a portion of the second metal layer 106 and a portion of the intermediate layer 102 from the second side 200b, thereby forming a first trace pattern 114a and second trace pattern 106a on the first and second sides 200a and 200b of the substrate 200 respectively. It is noteworthy that at this point the second trace pattern 106a comprises portions of the second metal layer 106 and portions of the intermediate layer 102. The second trace pattern 106a comprises a plurality of flip-chip bond pads 106b. In addition, the flip-chip bond pads 106b are concurrently defined with the second trace pattern 106a. The flip-chip bond pads 106b are directly connected with the metal block 104a.

Figure 7:
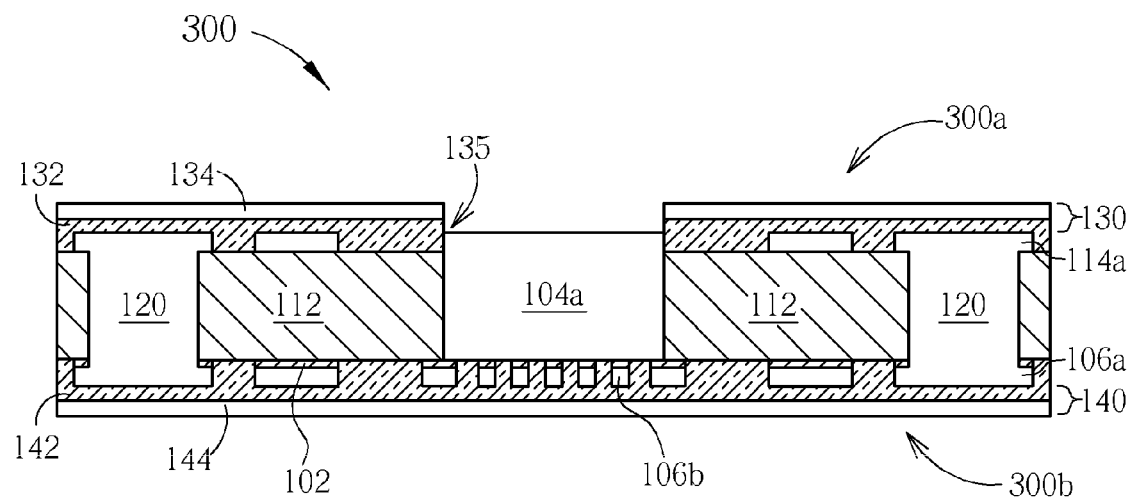

As shown in FIG. 7, an additive layer lamination process is carried out to laminate a second single-sided CCL 130 and a third single-sided CCL 140 on the first side 200a and the second side 200b of the substrate 200 respectively, thereby forming a four-layer substrate 300, wherein the second single-sided CCL 130 comprises a pre-routed opening 135 corresponding and conform to the metal block 104a such that after lamination a top surface of the metal block 104a is exposed through the opening 135. The second single-sided CCL 130 comprises a second insulating layer 132 such as a dielectric layer, and a second copper foil layer 134. The third single-sided CCL 140 comprises a third insulating layer 142 and a third copper foil layer 144.

Figure 8:
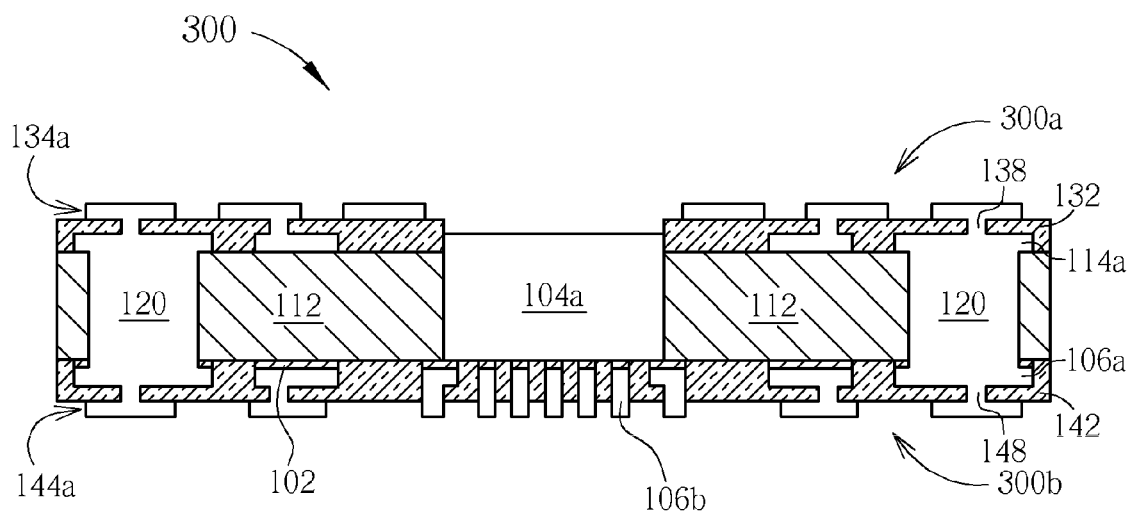

As shown in FIG. 8, a laser drill process, a PTH process and an external trace patterning process are sequentially performed to from a third trace pattern 134a on a first side 300a of the four-layer substrate 300 and a fourth trace pattern 144a on the second side 300b of the four-layer substrate 300, wherein the third trace pattern 134a is electrically connected to the first trace pattern 114a through the second plated through hole 138 that is formed in the second insulating layer 132, and the fourth trace pattern 144a is electrically connected to the second trace pattern 106a through the third plated through hole 148 that is formed in the third insulating layer 142.

Figure 9:
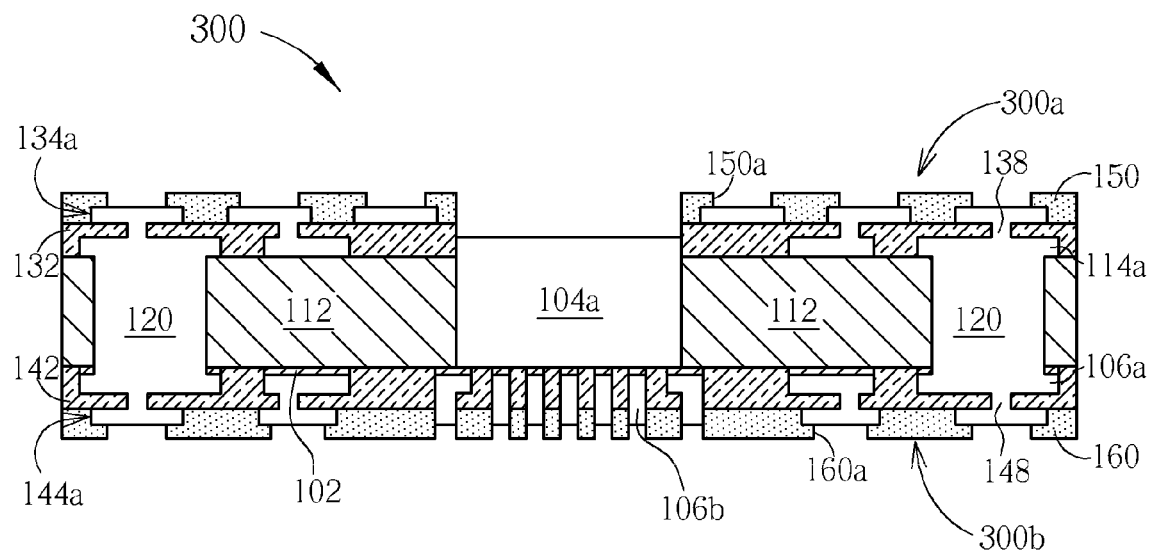

As shown in FIG. 9, subsequently, a solder resist coating process is performed to form a solder resist layer 150 and a solder resist layer 160 on the first side 300a and on the second side 300b of the four-layer substrate 300 respectively. The solder resist layer 150 and the solder resist layer 160 may be composed of light sensitive materials, which are known in the art. Thereafter, a lithographic process is carried out to form openings 150a and openings 160a in the solder resist layer 150 and the solder resist layer 160 respectively. The openings 150a and openings 160a expose portions of the third trace pattern 134a and portions of the fourth trace pattern 144a respectively.

Figure 10:
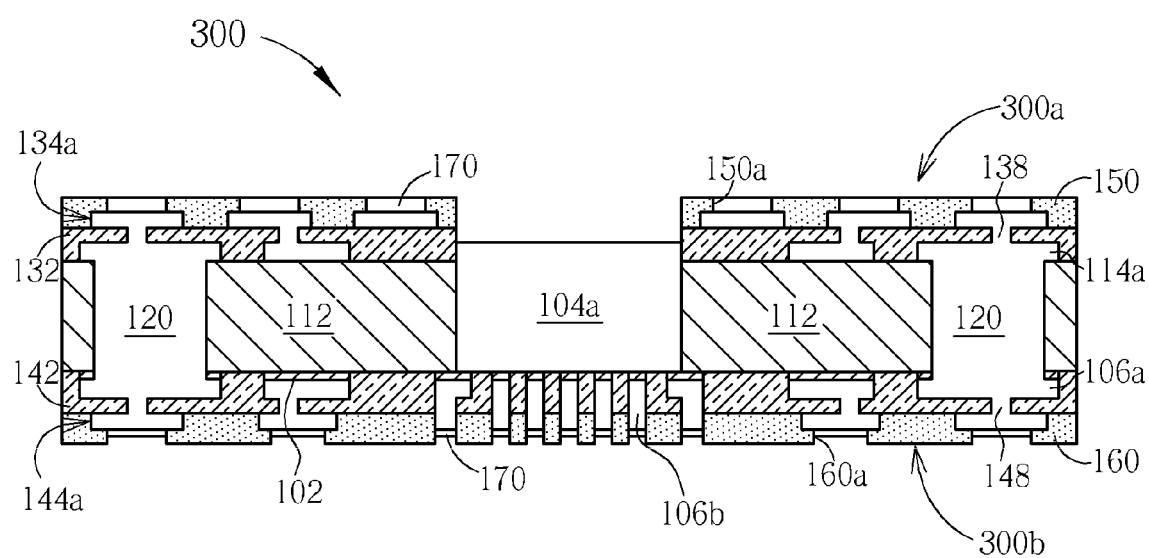

As shown in FIG. 10, a nickel/gold (Ni/Au) layer 170 or any suitable anti-oxidation surface finish is formed on the exposed portions of the third trace pattern 134a and on the exposed portions of the fourth trace pattern 144a. It is noteworthy that at this point the exposed top surface of the metal block 104a is not covered with the Ni/Au layer 170 or any anti-oxidation surface finish. To form such structure, the top surface of the metal block 104a may be covered with a photoresist layer prior to the formation of the Ni/Au layer 170 or any anti-oxidation surface finish, and after the formation of the Ni/Au layer 170 or any anti-oxidation surface finish, stripping the photoresist layer.

Figure 11:
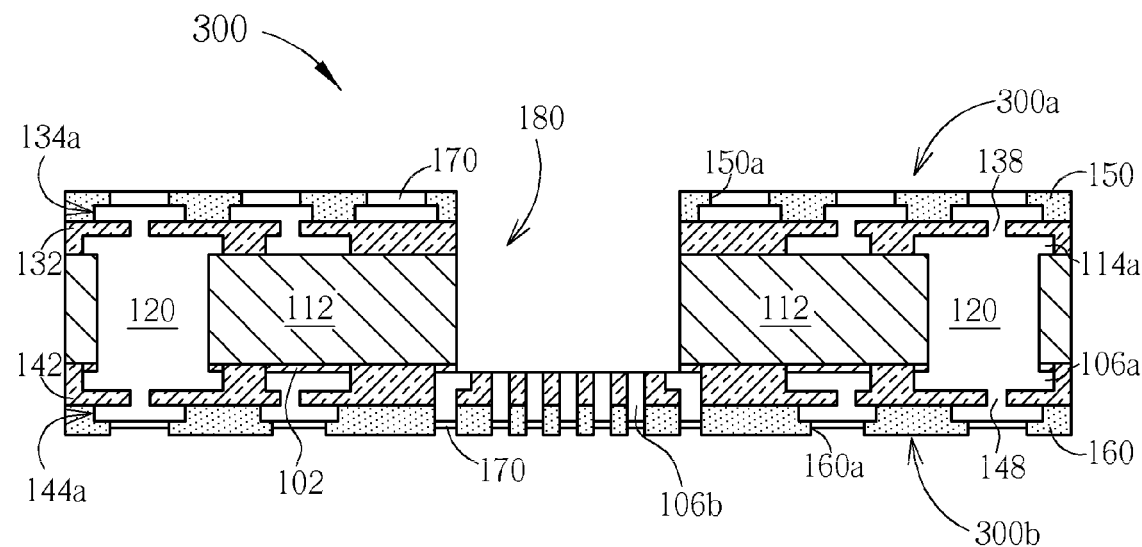

As shown in FIG. 11, after the formation of the Ni/Au layer 170, an alkaline etching process is performed to etch away the metal block 104a (not covered with the Ni/Au layer 170) and the intermediate layer directly underneath the metal block 104a, thereby forming a cavity 180 in the four-layer substrate 300. Subsequently, an acidic etching process is performed to micro-etch the bottom of the cavity 180 to expose the flip-chip bond pads 106b. It is to be understood that the four-layer substrate demonstrated through FIG. 2 to FIG. 11 is exemplary and is for illustration purposes only. The four-layer substrate demonstrated through FIG. 2 to FIG. 11 should not be used to limit the scope of this invention. The present invention may be applicable to dual-layer substrate, three-layer substrate, six-layer substrate, eight-layer substrate or any other kinds of package substrates.

Figure 12:
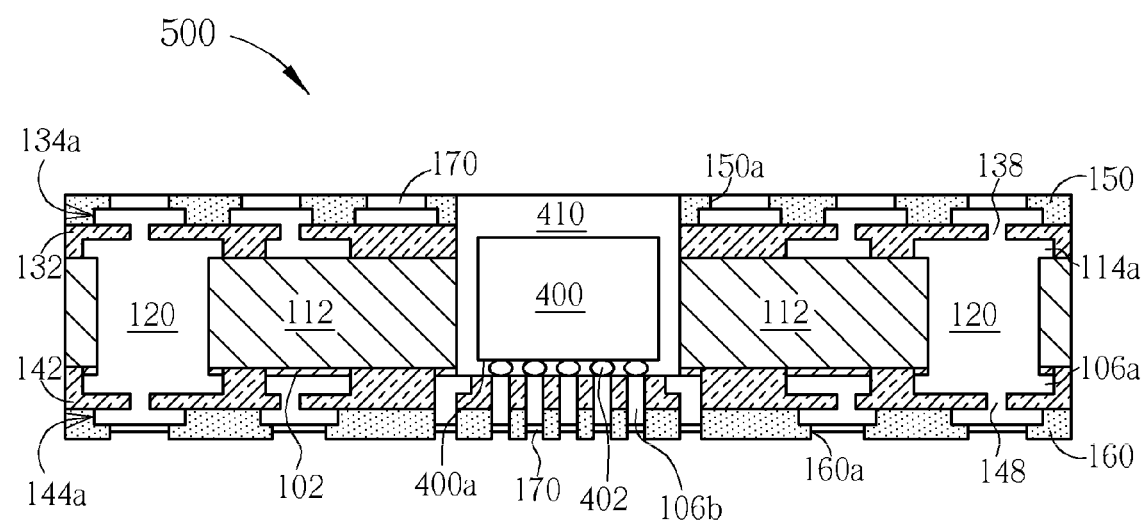

As shown in FIG. 12, after the formation of the cavity 180 of the four-layer substrate 300, a flip-chip 400 is mounted inside the cavity 180. The flip-chip 400 has an active surface 400a facing the flip-chip bond pads 106b and is electrically connected to corresponding flip-chip bond pads 106b through solder balls 402. A filler 410 such as epoxy resin based material is then used to fill the cavity 180 and encapsulate the flip-chip 400, thereby forming a package structure 500 with a flip-chip 400 embedded in the four-layer substrate 300. According to the preferred embodiment, at this point the surface of the filler 410 is approximately flush with the surface of the solder resist layer 150.

Figure 13:
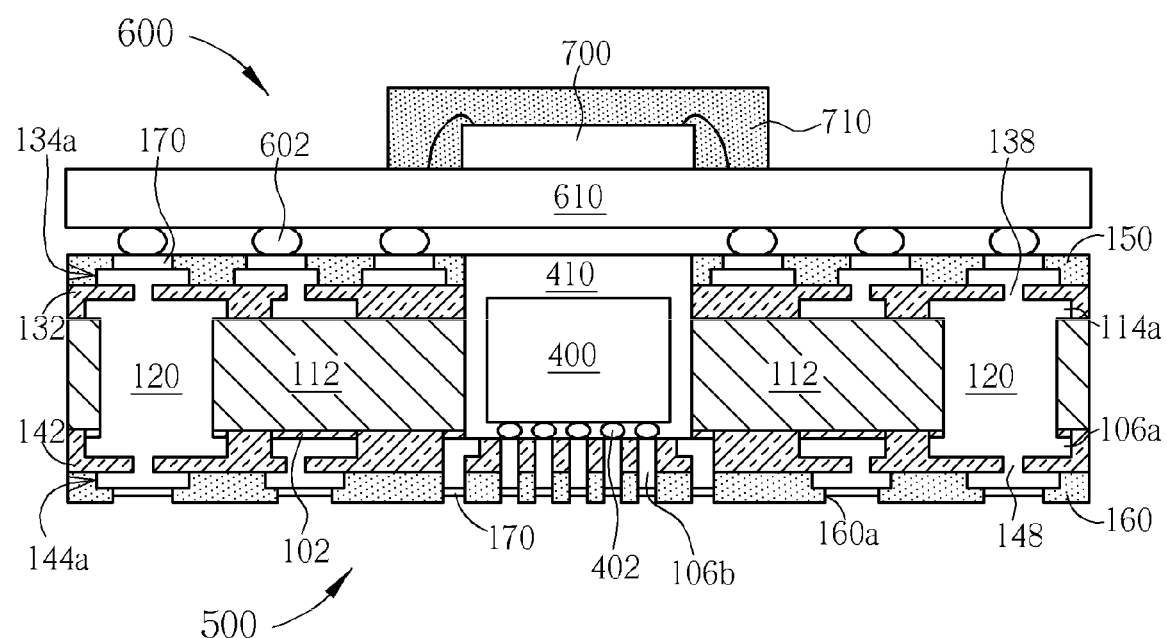

As shown in FIG. 13, after the formation of the package structure 500, an IC package 600 is stacked on the package structure 500. The IC package 600 comprises an integrated circuit die 700 mounted on a first side of the substrate 610, a molding compound 710 encapsulating the integrated circuit die 700, a plurality of solder balls 602 on a second side of the substrate 610 and electrically connecting to the third trace pattern 134a through the Ni/Au layer 170.

Those skilled in the art will readily observe that numerous modifications and alterations of the device and method may be made while retaining the teachings of the invention.

What is claimed is:

1. A package substrate with a cavity, comprising:
   a first insulating layer;
   a cavity in the first insulating layer;
   a first trace pattern on one side of the first insulating layer;
   a second trace pattern on the other side of the first insulating layer opposite being opposite to the first trace pattern, wherein the second trace pattern comprises a plurality of flip-chip bond pads at a bottom of the cavity, and a portion of the second trace pattern is a dual-layer metal structure comprising a copper layer and an intermediate metal layer; and
   a plurality of first plated through holes in the first insulating layer for electrically connecting the first trace pattern with the second trace pattern.

2. The package substrate of claim 1 wherein the intermediate metal layer comprises nickel or aluminum.

3. The package substrate of claim 1 further comprising a second insulating layer covering the first trace pattern, and a third trace pattern on the second insulating layer.

4. The package substrate of claim 3 further comprising a plurality of second plated through holes in the second insulating layer for electrically connecting the first trace pattern with the third trace pattern.

* * * * *